United States Patent
Wu et al.

(10) Patent No.: US 9,761,411 B2
(45) Date of Patent: Sep. 12, 2017

(54) SYSTEM AND METHOD FOR MASKLESS DIRECT WRITE LITHOGRAPHY

(71) Applicant: Taiwan Semiconductor Manufacturing Company, Ltd., Hsin-Chu (TW)

(72) Inventors: Cheng-Chi Wu, Hsin-Chu (TW); Jensen Yang, Hsin-Chu (TW); Wen-Chuan Wang, Hsin-Chu (TW); Shy-Jay Lin, Hsin-Chu (TW)

(73) Assignee: Taiwain Semiconductor Manufacturing Company, Ltd., Hsin-Chu (TW)

( * ) Notice: Subject to any disclaimer, the term of this patent is extended or adjusted under 35 U.S.C. 154(b) by 115 days.

(21) Appl. No.: 14/600,668

(22) Filed: Jan. 20, 2015

(65) Prior Publication Data

US 2016/0211117 A1  Jul. 21, 2016

(51) Int. Cl.
*G06F 17/50* (2006.01)
*H01J 37/302* (2006.01)
(Continued)

(52) U.S. Cl.
CPC ...... *H01J 37/3026* (2013.01); *G06F 17/5081* (2013.01); *H01J 37/3174* (2013.01);
(Continued)

(58) Field of Classification Search
CPC ......... H01J 37/3175; H01J 2237/31722; H01J 37/3026; H01J 37/3174; G06F 17/5081; G03F 7/2051; G03F 7/70058

See application file for complete search history.

(56) References Cited

U.S. PATENT DOCUMENTS 5,689,255 A * 11/1997 Frazier ............... G06T 9/005
                                                 341/51
6,498,685 B1 * 12/2002 Johnson ............. B81C 1/0038
                                                 347/241
(Continued)

OTHER PUBLICATIONS

Tang et al.; "LineDiff Entropy: Lossless Layout Data Compression Scheme for Maskless Lithography Systems"; Year: 2013; IEEE Signal Processing Letters; vol. 20, Issue: 7; pp. 645-648.*
(Continued)

*Primary Examiner* — Helen Rossoshek
(74) *Attorney, Agent, or Firm* — Haynes and Boone, LLP

(57) ABSTRACT

A system and method for maskless direct write lithography are disclosed. The method includes receiving a plurality of pixels that represent an integrated circuit (IC) layout; identifying a first subset of the pixels that are suitable for a first compression method; and identifying a second subset of the pixels that are suitable for a second compression method. The method further includes compressing the first and second subset using the first and second compression method respectively, resulting in compressed data. The method further includes delivering the compressed data to a maskless direct writer for manufacturing a substrate. In embodiments, the first compression method uses a run-length encoding and the second compression method uses a dictionary-based encoding. Due to the hybrid compression method, the compressed data can be decompressed with a data rate expansion ratio sufficient for high-volume IC manufacturing.

20 Claims, 5 Drawing Sheets

(51) Int. Cl.
*H01J 37/317* (2006.01)
*G03F 7/20* (2006.01)

(52) U.S. Cl.
CPC ........ *G03F 7/2051* (2013.01); *G03F 7/70058* (2013.01); *H01J 2237/3175* (2013.01)

(56) References Cited

U.S. PATENT DOCUMENTS

| | | | |
|---|---|---|---|
| 6,629,292 B1 * | 9/2003 | Corson | H01L 23/544 257/E23.179 |
| 6,653,954 B2 * | 11/2003 | Rijavec | H03M 7/40 341/63 |
| 7,368,738 B2 * | 5/2008 | Platzgummer | B82Y 10/00 250/398 |
| 7,477,772 B2 * | 1/2009 | Makarovic | G03F 7/70291 382/141 |
| 7,742,521 B2 * | 6/2010 | Vitali | H04N 19/176 375/240.03 |
| 7,934,172 B2 * | 4/2011 | Ivonin | G03F 7/70191 716/100 |
| 8,111,380 B2 * | 2/2012 | Abrams | G03F 7/70116 355/46 |
| 8,245,162 B2 * | 8/2012 | Abrams | G03F 7/70116 716/139 |
| 8,464,186 B2 | 6/2013 | Wang et al. | |
| 8,468,473 B1 | 6/2013 | Wang et al. | |
| 8,473,877 B2 | 6/2013 | Wang et al. | |
| 8,507,159 B2 | 8/2013 | Wang et al. | |
| 8,510,687 B1 | 8/2013 | Liu et al. | |
| 8,524,427 B2 | 9/2013 | Shin et al. | |
| 8,530,121 B2 | 9/2013 | Wang et al. | |
| 8,563,224 B1 | 10/2013 | Chen et al. | |
| 8,584,057 B2 | 11/2013 | Liu et al. | |
| 8,601,407 B2 | 12/2013 | Wang et al. | |
| 8,609,308 B1 | 12/2013 | Chen et al. | |
| 8,627,241 B2 | 1/2014 | Wang et al. | |
| 8,677,511 B2 | 3/2014 | Wang et al. | |
| 8,762,900 B2 | 6/2014 | Shin et al. | |
| 8,822,106 B2 | 9/2014 | Wang et al. | |
| 8,828,632 B2 | 9/2014 | Wang et al. | |
| 8,835,082 B2 | 9/2014 | Chen et al. | |
| 8,841,049 B2 | 9/2014 | Wang et al. | |
| 8,846,278 B2 | 9/2014 | Shin et al. | |
| 8,893,059 B2 * | 11/2014 | Carroll | G06F 17/5068 716/51 |
| 9,329,484 B1 * | 5/2016 | Markle | G03F 7/2051 |
| 2004/0201593 A1 * | 10/2004 | Nishimura | H04N 19/63 345/591 |
| 2005/0063472 A1 * | 3/2005 | Vella | H04N 19/176 375/240.22 |
| 2005/0097179 A1 * | 5/2005 | Orme | H04L 12/585 709/207 |
| 2009/0213354 A1 * | 8/2009 | Sandstrom | G03F 7/701 355/71 |
| 2014/0049413 A1 * | 2/2014 | Agarwal | H03M 7/30 341/87 |

OTHER PUBLICATIONS

Yang et al.; "A Lossless Circuit Layout Image Compression Algorithm for Maskless Lithography Systems"; Year: 2010; 2010 Data Compression Conference; pp. 109-118.*

Dai et al.; "Lossless compression of VLSI layout image data"; Year: 2006; IEEE Transactions on Image Processing vol. 15, Issue: 9; pp. 2522-2530.*

Vito Dai et al., "Full Chip Characterization of Compression Algorithms for Direct Write Maskless Lithography Systems," University of California, Berkley, 20 pages.

Mark A. McCord et al., "REBL: Design Progress Toward 16 nm Half-Pitch Maskless Projection Electron Beam Lithography," Proc. of SPIE vol. 8323, 832311 (2012), 11 pages, Alternative Lithographic Technologies IV.

Vito Dai, "Data Compression for Maskless Lithography Systems: Architecture, Algorithms and Implementation," University of California, Berkley (Spring 2008), 165 pages.

Yu-Chi Chen et al., "Method and Apparatus for Electron Beam Lithography," U.S. Appl. No. 14/088,667, 24 pages of text, 11 pages of drawings.

Yu-Chi Chen et al., "Method and Apparatus for Electron Beam Lithography," U.S. Appl. No. 14/090,000, 19 pages of text, 7 pages of drawings.

* cited by examiner

SYSTEM AND METHOD FOR MASKLESS DIRECT WRITE LITHOGRAPHY

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, electron beam (e-beam) technology has been used in the manufacturing of semiconductor devices using maskless lithography. In one example, a computer controlled e-beam data pattern generator (DPG) is used to direct an incident e-beam towards a semiconductor substrate coated with a layer of electron-sensitive resist (a target). The exposed portions of the resist are then developed, leaving a patterned resist layer on the semiconductor substrate as a masking element for further lithographic processes. A typical e-beam DPG uses an array of mirrors to deflect the incident e-beam in forming a gray-scale raster image on the target. The image to be formed is represented using pixels in digital format. In view of large amount of image data to be presented to and processed by the e-beam DPG, lossless data compression and decompression are generally used. However, it has been difficult to achieve sufficient compression while providing a high decompression data rate for high-volume semiconductor manufacturing.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
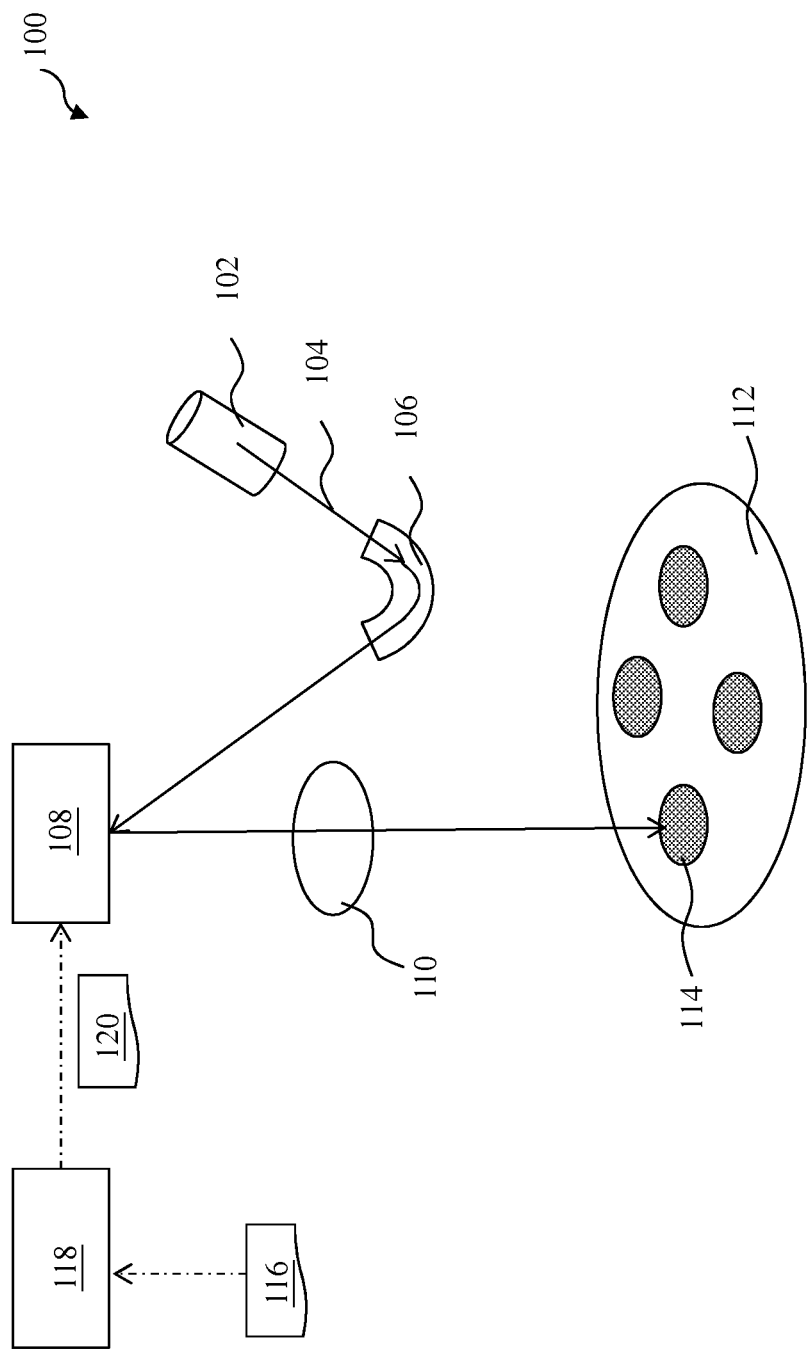
FIG. 1 is a simplified block diagram of an embodiment of an e-beam lithography system.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to maskless lithography systems and methods. More particularly, it is related to data delivery systems and methods in e-beam direct write lithography. E-beam direct write lithography holds the promise of producing more dense microchips with smaller features sizes. But, it generally suffers from low throughput. In order to maintain throughput comparable to today's optical lithography systems, it needs to handle data rate of up to 5 Terabits per second (Tb/sec). Lossless data compression and decompression has been implemented in data path design of e-beam direct write system for improving its throughput. Common approaches focus on compression methods with high compression ratio, defined as the ratio of raw data size over the compressed data size. High compression ratio reduces data rate requirement when delivering the compressed data to an e-beam direct writer. But it also complicates the data recovery process of the e-beam direct writer and results in low decompressed data rate thereof. On the other hand, simple compression methods generally do not produce enough data compression. The present disclosure addresses the above problem with a layout-adaptable hybrid compression/decompression method and system. As will be demonstrated, embodiments of the present disclosure are capable of producing high data compression while providing high decompressed data rate, thereby meeting demands for high-volume manufacturing by e-beam direct write systems. In the following discussion, embodiments and/or examples are given in terms of e-beam direct write lithography. However, the inventive concept of the present disclosure is not so limited and various embodiments can be applied in other maskless direct write systems, such as systems using ion beam, or other charged particles, instead of e-beam.

FIG. 1 illustrates an e-beam direct write system 100 that may benefit from one or more aspects of the present disclosure. Referring to FIG. 1, the system 100 is capable of performing e-beam direct writing in manufacturing or repairing a plurality of wafers. The system 100 includes an electron source 102 which generates an e-beam 104, a beam-bender 106, a digital pattern generator (DPG) 108, projection optics 110, and a rotary stage 112 which holds and aligns one or more substrates 114 for proper exposure in manufacturing or repairing an integrated circuit (IC). The e-beam 104 may be a single e-beam or multiple e-beams. In the embodiment as shown, the system 100 further includes a data compression unit 118 that is coupled to the DPG 108. The data compression unit 118 is configured to receive a data file 116. In an embodiment, the data file 116 includes an ordered set of pixels that represent a layout of the IC or a portion thereof. The data compression unit 118 compresses the data file 116 and produces a compressed data file 120. The compressed data file 120 is subsequently presented to the DPG 108 for data decompression and recovery. In the present embodiment, the data compression unit 118 and the DPG 108 are implemented in one system. Alternatively, they may be implemented in separate systems and are directly or indirectly coupled for data communication there between.

In an embodiment, the substrate 114 is a semiconductor wafer. The wafer 114 includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The wafer 114 is coated with a resist (or photoresist) layer prior to the exposure. The resist layer is sensitive to the incident e-beam 104 and may be a positive resist or a negative resist. A positive resist is generally insoluble in a developer but becomes soluble after being exposed to a radiation, such as the e-beam 104. A negative resist has the opposite behavior: it is generally soluble in a developer, but becomes insoluble upon radiation. The wafer 114 may be cleaned before and/or soft-baked after the resist coating. The DPG 108 either reflects or absorbs the e-beam 104 based on the data files 116/120 thereby exposing the resist layer with the IC layout. After the exposure, further steps are conducted to form the IC or a portion thereof using a lithography process. For example, the wafer 114 may undergo post-exposure baking, developing, and hard-baking processes thereby forming patterns in the resist layer. The wafer 114 is etched using the patterned resist layer as an etch mask. The etching process may include dry etching, wet etching, or other etching techniques. The resist layer may be subsequently stripped by a proper method such as wet stripping or plasma ashing. Further processes are performed to form various features onto the wafer 114, such as doped regions, dielectric features, and multilevel interconnects.

Figure 2:
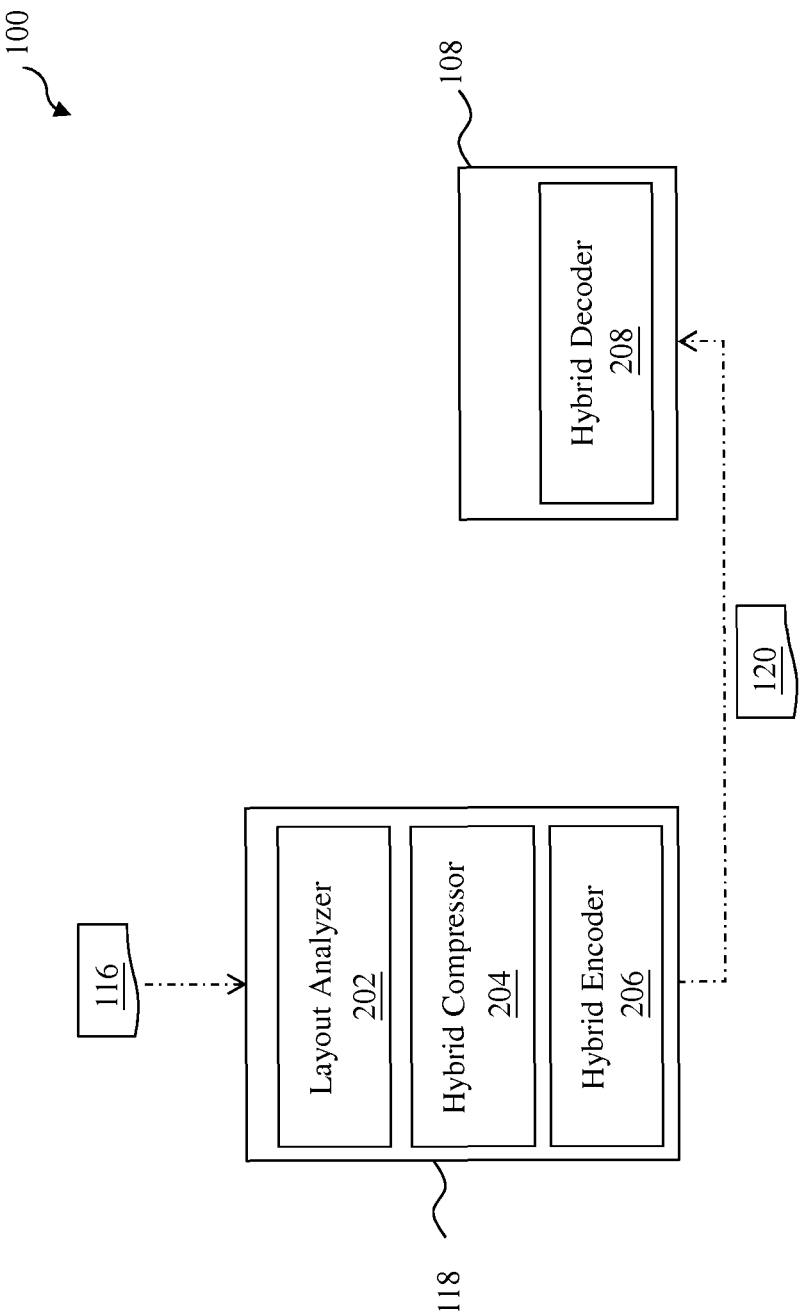
FIG. 2 is a simplified schematic diagram of a portion of the system of FIG. 1, in accordance with an embodiment.

FIG. 2 shows a simplified schematic diagram of the compression unit 118 and the DPG 108, constructed according to various embodiments of the present disclosure. Referring to FIG. 2, the compression unit 118 includes a layout analyzer 202, a hybrid compressor 204, and a hybrid encoder 206; and the DPG 108 includes a hybrid decoder 208.

The compression unit 118 is configured to receive an IC layout or a portion thereof presented in the data file 116. In various embodiments, the data file 116 is extracted layer by layer from a GDSII or OASIS design file of the IC, or from a design file in other suitable formats. The data file 116 may have incorporated proximity effect correction, location effect correction, and/or other shape corrections. In addition, the IC layout has been rendered into pixels with gray level assignments. For example, an IC pattern may be fractured into individual 20 nm (or smaller) pixel intensities calculated with a simplex based method. In an embodiment, 32 gray level intensities may be used. In an example, the data file 116 includes an ordered set of pixels that represent the IC layout with each pixel corresponding to one portion of the IC layout. The size of the portion depends on the diameter of the incident e-beam 104. Each pixel may include multiple bits, representing desirable gray-level intensity. The data file 116 is to be scanned by the DPG 108 onto the target 114. However, to reduce data rate requirements when delivering data from the compression unit 118 to the DPG 108, the data file 116 is compressed and encoded.

In an embodiment, the layout analyzer 202 analyzes an IC layout presented by the data file 116 and the analysis may include identifying portions of the IC layout suitable for particularly chosen compression methods. The rationale is that different layers of an IC layout or different portions within a layer may exhibit different characteristics. As a result, some portions may be well suited for one simple compression method (i.e. does not involve lots of computing complexity), and some other portions for another simple compression method. However, there may not be a single, yet simple, compression method for the whole. For example, a first portion of the data file 116 may be 20 consecutive gray-level intensities of 3. This is a good candidate for run-length encoding—instead of sending 20 data elements to the DPG 108, a pair of data elements (pixel value=3, repeats=20) may be sent. To continue the example, another portion of the data file 116 may be an alternating or a repeating data pattern, such as (2, 3, 2, 3, 2, 3) or (2, 1, 4, 3, 3, 2, 1, 4, 3, 3, 2, 1, 4, 3, 3), which is not well suited for run-length encoding, but particularly well suited for a dictionary-based encoding scheme. Yet another portion of the data file 116 may not be well suited for either the run-length encoding or the dictionary-based encoding. Understandably, a single complex compression method may be used to compress the data file 116. But, as discussed above, such approaches result in high design complexity of the DPG 108 and do not meet writing data rate demand for high-volume production. Various embodiments of the present disclosure explore the variances in the data file 116 and apply different, yet simple, compression methods to different portions of the data file 116 so as to achieve an overall good compression ratio while keeping the decompression and decoding in the DPG 108 relatively straight-forward.

In an example, the layout analyzer 202 determines that a first portion of the data file 116 is suitable for a first compression method, such as a run-length based compression method, and a second portion of the data file 116 is suitable for a second compression method, such as a dictionary-based compression method. In addition, the layout analyzer 202 may determine that a third portion of the data file 116 is not suitable for any of the simple compression methods and may be best left uncompressed. The first, second, and third portions may be interposed. For example, the data file 116 may include consecutive 12 pixels suitable for run-length encoding followed by consecutive 15 pixels suitable for dictionary-based encoding which is then followed by 8 pixels suitable for the run-length encoding. All different combinations and arrangements of the first, second, and third portions are within the scope of the present disclosure. The layout analyzer 202 may additionally build a dictionary if a dictionary-based encoding scheme is used. For example, a dictionary may be built into a storage element with a user-defined maximum entry limit. Each entry of the dictionary contains a word (or phrase) for encoding and decoding the data file 116. Using the example given above, if the data file 116 includes pixels (2, 1, 4, 3, 3, 2, 1, 4, 3, 3, 2, 1, 4, 3, 3), the dictionary may be built to have one entry A=(2, 1, 4, 3, 3) and the data encoded as (A, A, A). In various embodiments, the layout analyzer 202 may use two or more compression methods in its analysis and each of the compression methods may advantageously be a simple lossless compression method.

The hybrid compressor 204 compresses the data file 116 according to the analysis performed by the layout analyzer 202. To continue the example discussed above, the hybrid compressor 204 compresses the first portion of the data file 116 using the first compression method, compresses the second portion of the data file 116 using the second compression method, and keeps the third portion of the data file 116 as uncompressed data (i.e. raw data). If the layout analyzer 202 has built a dictionary, the hybrid compressor 204 uses it accordingly. As a result, the hybrid compressor 204 produces a stream of data that are compressed with different methods (and some portions of the data may not be compressed at all) and are generally intermingled. In order for the DPG 108 to recover the data file 116 properly, it needs to be conveyed with not only the mixed compressed data but also how the data is compressed. This may be accomplished by various designs or means. For example, out-of-band control signals may be used synchronously with the mixed compressed data and the control signals indicate to the DPG 108 the compression method used for the respective compressed data. In the present embodiment, the hybrid encoder 206 conveys data compression methods to the DPG 208 using an in-band signaling method—an instruction set.

In an embodiment, the hybrid encoder 206 uses an instruction set with 5-bit operational codes (or OPCODES). For example, it may use exemplary OPCODES as shown in Table 1 below.

TABLE 1

Exemplary OPCODES

| OPCODE | PARAMETER | DESCRIPTION |
|---|---|---|
| 00000 | | NOP (No Operation) |
| 00001 | CCCCC<br><byt> | Raw Data<br>CCCCC: 5-bit pixel count<br><byt>: the intensity level of the CCCCC uncompressed pixels |
| 00010 | CCCCC | Run-length-0<br>CCCCC: 5-bit pixel count of intensity level 0 |
| 00110 | CCCCC | Run-length-31<br>CCCCC: 5-bit pixel count of intensity level 31 |
| 10100 | AAAAA<br>AAAAA | Dictionary Look Up<br>Passes the entry of the dictionary at the 10-bit address of (AAAAA AAAAA) |

Understandably, the examples shown in Table 1 are not limiting. In various embodiments, the hybrid encoder 206 may use an instruction set with different OPCODES and/or different parameters. The hybrid encoder 206 simplifies data handling between the compression unit 118 and the DPG 108. As a result, the compressed data 120 is an encoded compressed data.

Still referring to FIG. 2, the hybrid decoder 208 resides in the DPG 108 and is responsible for recovering the data file 116 from the encoded compressed data 120. The hybrid decoder 208 reverses the data encoding and compression performed by the compression unit 118. In various embodiments, the hybrid decoder 208 has access to the dictionary built by the layout analyzer 202 or a copy thereof as well as the instruction set used by the hybrid encoder 206 or a copy thereof. Due to the encoding scheme, the hybrid decoder 208 is able to decode and decompress data in one step. Also, due to the simple encoding and compression methods used, the hybrid decoder 208 can generally be implemented with small gate counts and with minimal data path latency. This is particularly advantageous for a maskless lithography system, such as the e-beam direct write system 100, for several reasons. For example, it reduces power consumption of the DPG 108. It also leaves more room for placing micro-lens or mirrors into the DPG 108. In addition, it enables fast processing in the DPG 108 thereby providing sufficient data rate for high-volume IC production.

The partitioning of the compression unit 118 as shown in FIG. 2 is just an example. In various embodiments, the functions of the units 202, 204, and 206 may be flexibly divided, merged, or combined without departing from the scope of the present disclosure. In addition, the compression unit 118 and the DPG 108 may be implemented in one system or separate systems, and may be coupled with hardwiring, cables, or wireless communication channels. Furthermore, the compression unit 118 and the DPG 108 may be implemented using hardware/software system(s) capable of executing a series of instructions and the hardware/software system may include one or more of the following: a general purpose microprocessor, a special purpose microprocessor, a field programmable gate array (FPGA), an application specific integrated circuit (ASIC), storage devices, and other peripheral devices.

Figure 3:
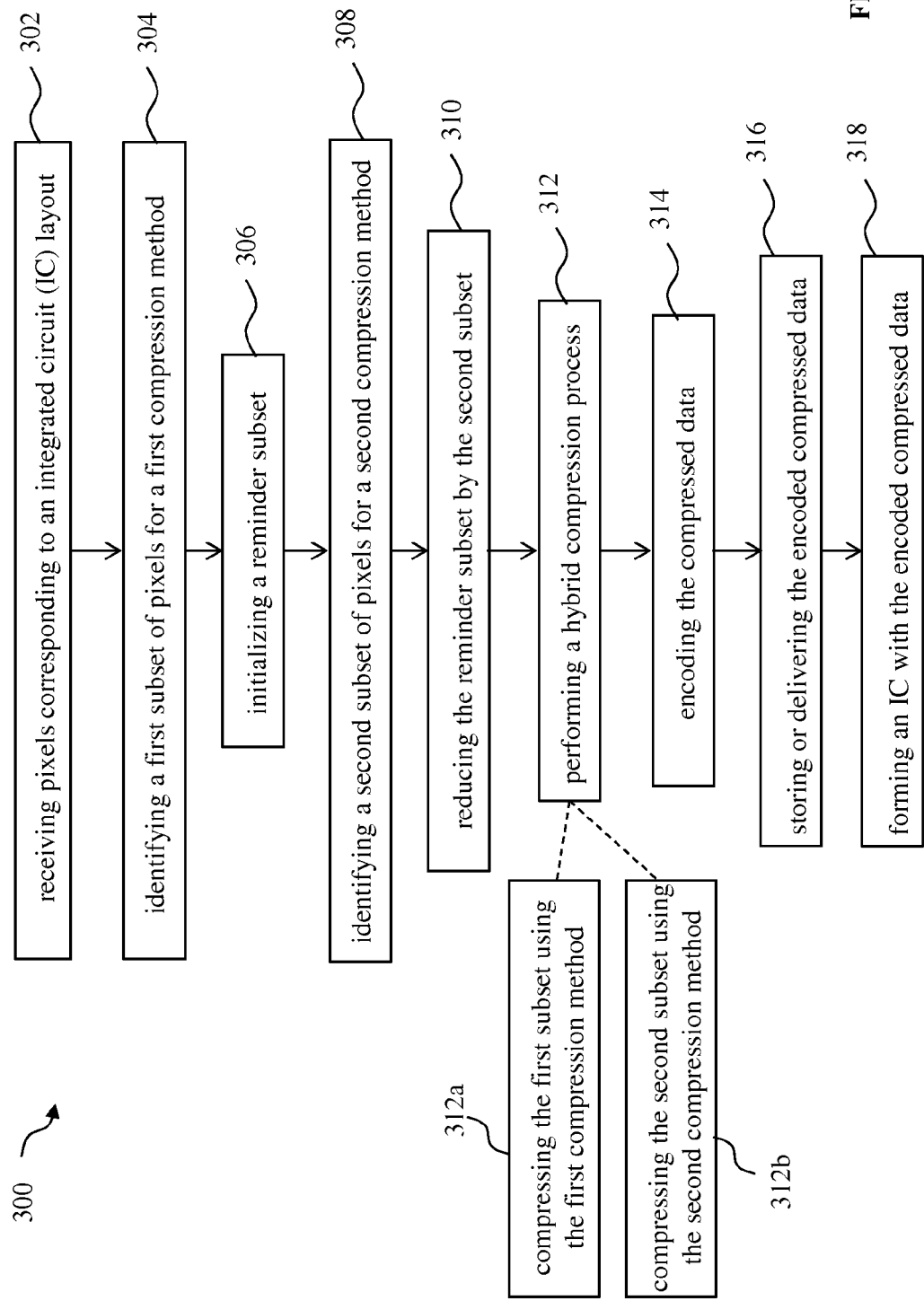
FIG. 3 shows a method of manufacturing wafers according to various aspects of the present disclosure.

FIG. 3 shows a flow chart of a method 300 for manufacturing an IC (or a plurality of ICs) using the system 100 (FIG. 1), according to various aspects of the present disclosure. Particularly, the method 300 includes steps of performing IC layout data analysis, identification, compression, and encoding as discussed above with reference to the compression unit 118 (FIG. 2). Additional operations can be provided before, during, and after the method 300, and some operations described can be replaced, eliminated, or moved around for additional embodiments of the method. The method 300 is an example, and is not intended to limit the present disclosure beyond what is explicitly recited in the claims. The method 300 is described below in conjunction with FIGS. 1 and 2.

At operation 302, the method 300 receives a data file 116 that includes a plurality of pixels corresponding to an integrated circuit (IC) layout or a portion thereof. The plurality of pixels is organized in an ordered set (i.e., a sequence). In an embodiment, the plurality of pixels is presented in a computer-readable medium. The plurality of pixels may have incorporated proximity effect correction, location effect correction, and/or other shape corrections. In an embodiment, the plurality of pixels is assigned with gray level intensities from 0 to 31.

At operation 304, the method 300 identifies a first subset of pixels from the plurality of pixels that are suitable for a first compression method. In an embodiment, this is accomplished by analyzing the ordered set using the first compression method and a set of user-defined parameters. In an example, the first compression method is a run-length compression method and the user-defined conditions include "greater than m consecutive pixels with the same intensity level" wherein "m" is a user-defined parameter. To continue the example, any subset of pixels that meets the criteria is included into the first subset. In various embodiments, the first compression method is a lossless simple compression method.

At operation 306, the method 300 initializes a reminder subset that includes members of the plurality of pixels excluding those in the first subset. The reminder subset is stored in a temporary storage for use by further steps. In special cases, the reminder subset may be empty and the method 300 may jump to operation 312 for compression. However, in reality, the reminder subset is typically not empty.

At operation 308, the method 300 identifies a second subset of pixels from the reminder subset that are suitable for a second compression method. Since the second subset is selected from the reminder subset, it does not overlap with the first subset. In an embodiment, this is accomplished by analyzing the reminder subset using the second compression method and a set of user-defined parameters. In an example, the second compression method is a dictionary-based compression method and the user-defined parameters include maximum number of dictionary entries (e.g., 1024), maximum word length (e.g., 32), minimum word length (e.g., 8), and threshold of occurrence (e.g., 2). To further the example, operation 308 builds a dictionary and any pixels that can be encoded with the dictionary are included into the second subset. In an embodiment, the dictionary can be built independent of the IC layout. In the present embodiment, the dictionary is built adaptable to the IC layout, which typically optimizes the data compression thereof. In various embodiments, the second compression method is a lossless simple compression method. A more detailed discussion about operation 308 will be presented with reference to FIG. 4.

At operation 310, the method 300 reduces the reminder subset by the second subset, i.e., removes from the reminder subset those pixels that have been included into the second subset. In some cases, the reminder subset may become empty thereafter, which indicates that the ordered set will be fully compressed by the first and second compression methods. In some cases, there are still some pixels left in the reminder subset. In these cases, the method 300 may further include identifying a third subset of pixels for a third compression method using a step similar to operations 304 or operation 308. In the present embodiment, the pixels in the reminder subset will be left uncompressed (i.e., raw data) after operation 310.

At operation 312, the method 300 performs a hybrid compression process. In the present embodiment, this includes compressing the first subset using the first compression method (operation 312a) and compressing the second subset using the second compression method (operation 312b). In the present embodiment, the first compression method is a run-length compression method and the second compression method is a dictionary-based compression method. In addition, the pixels in the reminder subset are not compressed. Operation 312 produces a compressed data that generally includes a first portion compressed with the first compression method, a second portion compressed with the second compression method, and a third portion raw data, wherein the first, second, and third portions are generally intermingled.

At operation 314, the method 300 encodes the compressed data using an instruction set. This is similar to what has been discussed with reference to the hybrid encoder 206 (FIG. 2). Operation 314 produces an encoded compressed data 120.

At operation 316, the method 300 delivers the encoded compressed data 120 to a maskless direct writer, such as the system 100 (FIG. 1), for manufacturing a substrate. In an embodiment, the method 300 stores the encoded compressed data 120 in a tangible media that is accessible by the maskless direct writer. To further this embodiment, the IC layout may be compressed once and subsequently used many times for high-volume fabrication. In another embodiment, the method 300 delivers the encoded compressed data 120 as it becomes available and only stores it partially for data buffering purposes. This reduces storage requirement in the system 100.

At operation 318, the method 300 forms an IC or a portion thereof with the encoded compressed data. In an embodiment, this includes a decoding and decompression process that reverses what has been done to the data file 116 by operations 312 and 314. This is similar to what has been discussed with reference to the hybrid decoder 208 (FIG. 2). After the ordered set of pixels has been recovered, the maskless direct writer exposes a target with the pixels, forming patterns thereon. This is similar to what has been discussed with reference to FIG. 1.

Even though the above discussion has been directed to high-volume wafer production, the inventive concepts can be similarly applied to mask fabrication, wherein the substrate 114 (FIG. 1) is a mask substrate that may include a low thermal expansion material such as quartz, silicon, silicon carbide, or silicon oxide-titanium oxide compound.

Figure 4:
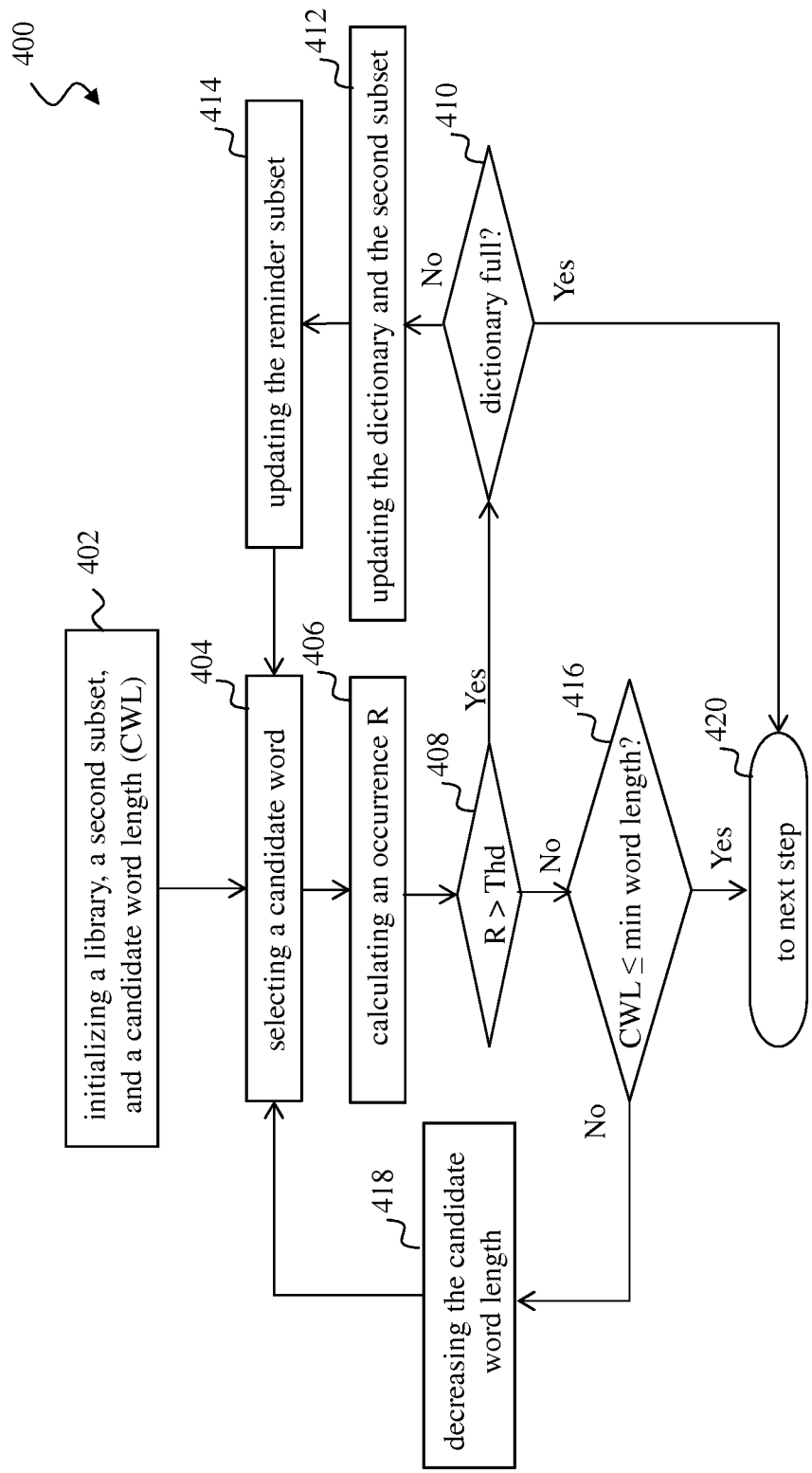
FIG. 4 shows a flow chart of a portion of the method of FIG. 3, in accordance with an embodiment.

FIG. 4 shows a flow chart of a method 400 which is an embodiment of operation 308 (FIG. 3). The method 400 is briefly described below.

At operation 402, the method 400 initializes a library in a storage media or in an internal memory of the compression unit 118. The method 400 also initializes a second subset to be initially empty and a candidate word length (CWL) to be initially the maximum word length which is a user-defined or system-determined parameter.

At operation 404, the method 400 selects a candidate word from the pixels in the reminder subset. A candidate word is a segment of consecutive CWL pixels, i.e., the number of pixels in the candidate word equals to CWL. In an embodiment, operation 404 identifies all possible candidate words in the reminder subset using a sliding window method. For example, using a sliding scale of 1 and from an ordered set of pixels (1, 2, 3, 4, 5, 6, 7), operation 404 produces two candidate words with CWL=6: Candidate word A=(1, 2, 3, 4, 5, 6) and Candidate word B=(2, 3, 4, 5, 6, 7).

At operation 406, the method 400 calculates a number of occurrences, R, for each of the candidate words identified. For example, if a candidate word appears once in the reminder subset, its number of occurrences equals to 1; if a candidate word appears twice in the reminder subset, its number of occurrences equals to 2; and so on. In an embodiment, operation 406 further ranks the candidate words by their respective number of occurrences and uses the highest ranked candidate word for next operation.

In an embodiment, the method 400 performs operations 404 and 406 simultaneously wherein it scans over the reminder subset by a sliding window method to find all possible candidate words, calculates respective occurrences of the candidate words during the scanning, and ranks the candidate words. This saves computing resources and speeds up the operation. Furthermore, in an embodiment, operations 404 and 406 create and maintain a list of candidate words along with their ranks. The list can be used by later operations to speed up the overall process.

At operation 408, the method 400 determines if the highest ranked candidate word has appeared in the reminder set sufficiently enough to be added to the dictionary. In an embodiment, this is accomplished by comparing the number of occurrences, R, of the highest ranked candidate word with a user-defined parameter—the threshold of occurrence, Thd. If the condition "R>Thd" is met, the candidate word becomes a qualified candidate word and the method 400 moves to operation 410. If the candidate word is not qualified, the method 400 moves to operation 416.

At operation 410, the method 400 determines if the dictionary is full, i.e., the number of entries in the dictionary has reached the maximum entry limit. If the dictionary is full, the method 400 moves to operation 420 which connects to next step in the method 300 (FIG. 3). Otherwise, the method 400 moves to operation 412.

At operation 412, the method 400 updates the dictionary and the second subset. In an embodiment, this includes adding a qualified candidate word to the dictionary and moving all occurrences of the qualified candidate word from the reminder subset to the second subset. In another embodiment, operation 412 updates the dictionary and the second subset with the qualified candidate word that has the highest number of occurrences.

At operation 414, the method 400 updates the reminder subset by subtracting from it all occurrences of the qualified candidate words that have been added to the dictionary. Afterwards, the method 400 gets the next highest ranked candidate word, for example, by looking up in a list of candidate words created in a previous loop by operations 404 and 406, and repeats operations 408, 410, 412, and 414. The method 400 iteratively repeats the above operations until either it finds no qualified candidate word (operation 408) or it finds that the dictionary is full (operation 410).

At operation 416, the method 400 determines if the candidate word length CWL is less than or equal to the minimum word length which is a user-defined or system-determined parameter. If it is, the method 400 moves to operation 420. Otherwise, the method 400 moves to operation 418.

At operation 418, the method 400 decreases the candidate word length CWL. In an embodiment, operation 418 decreases CWL by 1 upon each entry. In another embodiment, operation 418 decreases CWL by a user-defined parameter. Afterwards, the method 400 moves to operation 404 and iteratively repeats operations 404, 406, 408, 410, 412, 414, and 416 until one of the conditions for moving to operation 420 is satisfied in operations 410 and 416.

Figure 5:
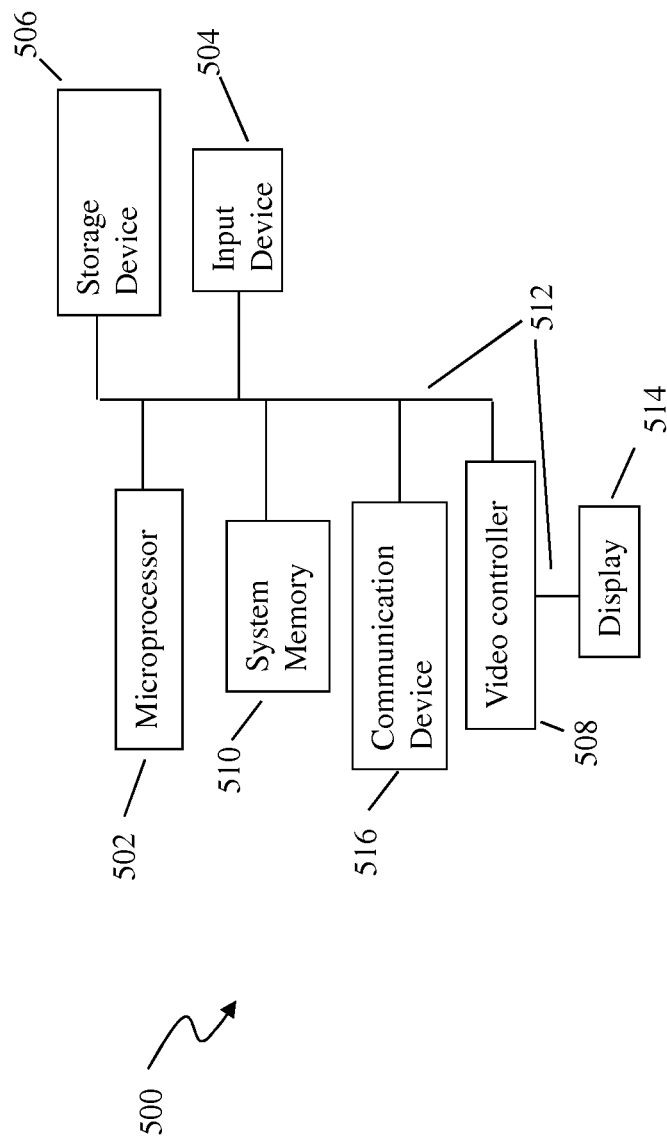
FIG. 5 is an illustration of a hardware/software system for implementing one or more embodiments of the present disclosure.

FIG. 5 illustrates a hardware/software system 500 as an embodiment of the compression unit 118 and/or the DPG 108 (FIG. 1). The system 500 includes a microprocessor 502, an input device 504, a storage device 506, a video controller 508, a system memory 510, a display 514, and a communication device 516, all interconnected by one or more buses 512. The storage device 506 could be a floppy drive, hard drive, CD-ROM, optical drive, or any other form of storage device. In addition, the storage device 506 may be capable of receiving a floppy disk, CD-ROM, DVD-ROM, or any other forms of computer-readable medium that may contain computer-executable instructions. Furthermore, communication device 516 could be a modem, network card, or any other device to enable the computer system to communicate with other nodes.

In an embodiment, the microprocessor 502 is a general purpose microprocessor. Alternatively, the microprocessor 502 is a dedicated hardware platform, such as a field programmable gate array (FPGA) or an application specific integrated circuit (ASIC).

A hardware/software system, such as the system 500, typically includes at least hardware capable of executing machine readable instructions, as well as the software for executing acts (typically machine-readable instructions) that produce a desired result.

Hardware generally includes at least processor-capable platforms, such as client-machines (also known as personal computers or servers) and hand-held processing devices (such as smart phones, personal digital assistants (PDAs), or personal computing devices (PCDs)). Further, hardware may include any physical device that is capable of storing machine-readable instructions, such as memory or other data storage devices. Other forms of hardware include hardware sub-systems, including transfer devices such as modems, modem cards, ports, and port cards, for example, and processing devices such as a field programmable gate array (FPGA), an application specific integrated circuit (ASIC), for example.

Software includes any machine code stored in any memory medium, such as RAM or ROM, and machine code stored on other devices (such as floppy disks, flash memory, or a CD ROM, for example). Software may include source or object code, for example. In addition, software encompasses any set of instructions capable of being executed in a client machine or server.

Combinations of software and hardware could also be used for providing enhanced functionality and performance for certain embodiments of the present disclosure. One example is to directly manufacture software functions into a silicon chip. Accordingly, it should be understood that combinations of hardware and software are also included within the definition of a hardware/software system and are thus envisioned by the present disclosure as possible equivalent structures and equivalent methods.

Computer-readable mediums include passive data storage, such as a random access memory (RAM) as well as semi-permanent data storage such as a compact disk read only memory (CD-ROM). In addition, an embodiment of the present disclosure may be embodied in the RAM of a computer to transform a standard computer into a new specific computing machine.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

The system may be designed to work on any specific architecture. For example, the system may be executed on a single computer, local area networks, client-server networks, wide area networks, internets, hand-held and other portable and wireless devices and networks.

Although not intended to be limiting, one or more embodiments of the present disclosure provide many benefits to semiconductor manufacturing using maskless direct write lithography. For example, embodiments of the present disclosure provide an overall good IC layout compression ratio (CR) while keeping the decompression and decoding in the maskless direct writer relatively straight-forward, thereby providing good decompression data rate. A relatively high data-rate expansion ratio (DER), defined as a ratio of the decompressed data rate over the compressed data rate, has been achieved in experiments. In many instances, the DER has been roughly equal to the CR and both are greater than 3, which meet the demand for high-volume IC fabrication. In addition, various embodiments of the present disclosure can be implemented with small gate counts and with minimal data path latency. This is particularly advantageous for a maskless lithography system because it reduces power consumption of the system, leaves more room for placing micro-lens or mirrors into the system, and enables fast processing in the system thereby providing sufficient data rate for high-volume IC production.

In one exemplary aspect, the present disclosure is directed to a method of manufacturing a substrate. The method includes receiving a plurality of pixels that represent an integrated circuit (IC) layout; identifying a first subset of the pixels that are suitable for a first compression method; and identifying a second subset of the pixels that are suitable for a second compression method, wherein the second subset does not overlap with the first subset. The method further includes performing a compression process to the pixels, resulting in compressed data. The compression process includes compressing the first subset using the first compression method and compressing the second subset using the second compression method. The method further includes delivering the compressed data to a maskless direct writer for manufacturing the substrate.

In another exemplary aspect, the present disclosure is directed to a method of forming an integrated circuit (IC). The method includes receiving an ordered set of pixels that represent a layout of the IC and identifying a first subset of the pixels by analyzing the ordered set using a first compression method. The method further includes initializing a reminder subset that includes members of the ordered set other than those in the first subset and identifying a second subset of the pixels by analyzing the reminder subset using a second compression method. The method further includes reducing the reminder subset by the second subset. The method further includes performing a compression process to the ordered set, resulting in compressed data. The compression process includes compressing members of the first subset using the first compression method and compressing members of the second subset using the second compression method. The method further includes storing the compressed data in a tangible media for use by a further IC process stage.

In another exemplary aspect, the present disclosure is directed to a maskless direct write lithography system. The system includes a compression unit that is configured to receive an ordered set of pixels that represent an integrated circuit (IC) layout. The compression unit is further configured to generate compressed data by compressing a first portion of the ordered set using a run-length compression method and compressing a second portion of the ordered set using a dictionary-based compression method. The compression unit is further configured to encode the compressed data using an instruction set, resulting in encoded compressed data. In embodiments, the system further includes a decoder unit that is coupled to the compression unit and is configured to recover the ordered set of pixels from the encoded compressed data.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising the steps of:
   receiving a plurality of pixels that represent an integrated circuit (IC) layout;
   identifying a first subset of the pixels that are suitable for a first compression method;
   identifying a second subset of the pixels that are suitable for a dictionary-based compression method, wherein the second subset does not overlap with the first subset and the identifying the second subset of the pixels includes:
      initializing a reminder subset that includes members of the plurality of pixels other than those in the first subset;
      initializing a dictionary;
      selecting a candidate word from the reminder subset, wherein the candidate word has a word length of M consecutive pixels;
      checking a number of occurrences of the candidate word in the reminder subset; and
      if the number of occurrences is greater than an occurrence threshold and the dictionary is not full, performing an update process that includes:
         adding the candidate word to the dictionary; and
         moving all occurrences of the candidate word from the reminder subset to the second subset;
   performing a compression process to the pixels, resulting in compressed data, wherein the compression process includes:
      compressing the first subset using the first compression method; and
      compressing the second subset using the dictionary-based compression method; and
   delivering the compressed data to a maskless direct writer for manufacturing a substrate, wherein at least one of the steps is performed by a computer.

2. The method of claim 1, further comprising:
   encoding the compressed data using an instruction set, resulting in an encoded compressed data, wherein the delivering of the compressed data includes delivering the encoded compressed data.

3. The method of claim 2, wherein the maskless direct writer is configured to recover the plurality of pixels from the encoded compressed data and the instruction set.

4. The method of claim 1, wherein both the first and the second compression methods are lossless compression.

5. The method of claim 1, wherein the first compression method is a run-length compression method.

6. The method of claim 1, further comprising, before the performing of the update process:
   ranking all candidate words having a word length of M by their respective number of occurrences in the reminder subset, wherein the performing of the update process is executed according to the ranking.

7. The method of claim 1, further comprising:
   performing a first iterative process that iteratively repeats the steps of selecting, checking, and conditionally performing the update process until one of following conditions occurs:
   the dictionary reaches a maximum entry limit; and
   the reminder subset does not contain a candidate word that has a word length of M and has a number of occurrences greater than the occurrence threshold.

8. The method of claim 7, further comprising:
   performing a second iterative process that iteratively repeats the first iterative process for every word length from M consecutive pixels down to N consecutive pixels, wherein both M and N are integers and N is greater than zero and less than M.

9. The method of claim 1, wherein the delivering of the compressed data includes delivering the dictionary.

10. A method, comprising the steps of:
    receiving an ordered set of pixels that represent a layout of an integrated circuit (IC);

identifying a first subset of the pixels that are suitable for a first compression method;
initializing a reminder subset that includes members of the ordered set other than those in the first subset;
identifying, from the reminder subset, a second subset of the pixels that are suitable for a second compression method, wherein the identifying of the second subset includes:
  initializing a dictionary;
  initializing a candidate word length to be a maximum word length;
  selecting candidate words from the reminder subset, wherein each of the candidate words has a word length equal to the candidate word length;
  for each of the candidate words, calculating a number of occurrences of the respective candidate word in the reminder subset; and
  for each of the candidate words, if the respective number of occurrences is greater than an occurrence threshold and the dictionary is not full, performing an update process that includes:
    adding the respective candidate word to the dictionary; and
    moving all occurrences of the respective candidate word in the reminder subset to the second subset;
performing a compression process to the ordered set, using a computer, resulting in compressed data, wherein the compression process includes:
  compressing members of the first subset using the first compression method; and
  compressing members of the second subset using the second compression method; and
delivering the compressed data to a maskless direct writer for manufacturing a substrate.

11. The method of claim 10, further comprising:
encoding the compressed data using an instruction set, resulting in an encoded compressed data, wherein the delivering of the compressed data includes delivering the encoded compressed data.

12. The method of claim 11, further comprising:
recovering the ordered set of pixels from the encoded compressed data and the instruction set.

13. The method of claim 10, wherein the first compression method is a run-length compression method and the second compression method is a dictionary-based compression method.

14. The method of claim 10, further comprising, before the performing of the update process:
ranking the candidate words by their respective number of occurrences in the reminder subset.

15. The method of claim 10, further comprising:
decreasing the candidate word length; and
iteratively repeating the steps of selecting candidate words, calculating number of occurrences, conditionally performing the update process, and decreasing the candidate word length until one of following conditions occurs:
the dictionary reaches a maximum entry limit; and
the candidate word length becomes equal to or less than a minimum word length.

16. The method of claim 10, wherein the delivering the compressed data to a maskless direct writer includes delivering the dictionary.

17. A method, comprising the steps of:
receiving a plurality of pixels that represent an integrated circuit (IC) layout;
identifying a first subset of the plurality of pixels that are suitable for a run-length compression method;
identifying a second subset of the plurality of pixels that are suitable for a dictionary-based compression method, wherein the second subset does not overlap with the first subset and the identifying the second subset includes:
  initializing a reminder subset that includes members of the plurality of pixels other than those in the first subset;
  initializing a dictionary;
  selecting a candidate word from the reminder subset, wherein the candidate word has a word length of M consecutive pixels;
  checking a number of occurrences of the candidate word in the reminder subset; and
  if the number of occurrences is greater than an occurrence threshold and the dictionary is not full, performing an update process that includes:
    adding the candidate word to the dictionary; and
    moving all occurrences of the candidate word from the reminder subset to the second subset;
performing a compression process to the pixels by a computer, resulting in compressed data, wherein the compression process includes:
  compressing the first subset using the run-length compression method; and
  compressing the second subset using the dictionary-based compression method;
encoding the compressed data using an instruction set, resulting in encoded compressed data; and
delivering the encoded compressed data to a maskless direct writer for manufacturing a substrate, wherein the maskless direct writer is configured to recover the plurality of pixels from the encoded compressed data and the instruction set.

18. The method of claim 17, further comprising, before the performing of the update process:
ranking the candidate words by their respective number of occurrences in the reminder subset.

19. The method of claim 17, further comprising:
decreasing the candidate word length; and
iteratively repeating the steps of selecting the candidate word, calculating number of occurrences, conditionally performing the update process, and decreasing the candidate word length until one of following conditions occurs:
the dictionary reaches a maximum entry limit; and
the candidate word length becomes equal to or less than a minimum word length.

20. The method of claim 17, wherein the delivering of the encoded compressed data includes delivering the dictionary.

* * * * *